(12) United States Patent
Yi

(10) Patent No.: US 7,191,545 B2
(45) Date of Patent: Mar. 20, 2007

(54) APPARATUS TO DRY SUBSTRATES

(75) Inventor: Hun-Jung Yi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/142,335

(22) Filed: Jun. 2, 2005

(65) Prior Publication Data

US 2006/0005422 A1    Jan. 12, 2006

(30) Foreign Application Priority Data

Jul. 7, 2004    (KR) ..................... 10-2004-0052647

(51) Int. Cl.
  *F26B 19/00*   (2006.01)
(52) U.S. Cl. ........................... 34/89; 34/351
(58) Field of Classification Search ............ 34/78, 34/470, 73, 77, 351, 352, 89, 88; 250/339.13, 250/343, 353
See application file for complete search history.

(56) References Cited

U.S. PATENT DOCUMENTS

| 5,054,210 A | 10/1991 | Schumacher et al. |
| 5,492,718 A | 2/1996 | O'Neill et al. |
| 5,829,156 A | 11/1998 | Shibasaki et al. |
| 5,940,985 A * | 8/1999 | Kamikawa et al. ........... 34/471 |
| 6,655,042 B2 * | 12/2003 | Yi et al. ....................... 34/340 |
| 6,909,973 B2 * | 6/2005 | Arno ........................... 702/28 |

FOREIGN PATENT DOCUMENTS

| DE | 1779075 | 8/1971 |
| EP | 1216390 | 6/2002 |
| JP | 05-132393 | 5/1993 |
| JP | 10-335299 | 12/1998 |
| KR | 1020000021787 A | 4/2000 |

* cited by examiner

*Primary Examiner*—Kenneth Rinehart
(74) *Attorney, Agent, or Firm*—Volentine & Whitt, PLLC

(57) ABSTRACT

The present invention disclosed herein is an apparatus for drying a substrate. In accordance with the present invention, the apparatus includes a measuring unit to detect a density of IPA vapor at predetermined regions in a process chamber or a pipe. The measuring unit has a radiating unit, a detection unit, and a window unit. The radiating unit transmits infrared-ray in a wavenumber region where light is absorbed by the IPA vapor.

18 Claims, 13 Drawing Sheets

APPARATUS TO DRY SUBSTRATES

BACKGROUND OF THE INVENTION

1. Field of the Invention

The present invention generally relates to an apparatus used to fabricate semiconductor devices. More specifically, the present invention generally relates to an apparatus used to dry semiconductor substrates.

A claim of priority is made to Korean Patent Application No. 2004-52647, filed on Jul. 7, 2004, the contents of which is herein incorporated by reference.

2. Description of the Related Art

Residual chemicals, small particles, and contaminants generated on semiconductor wafers during a fabrication process must be removed using one or more cleaning processes. The cleaning processes include a chemical process, a rinsing process, and a drying process. The chemical process is performed to etch and peel contaminants off wafers by a reaction with a chemical solution such as fluorine. The rinsing process is performed to clean the chemically-treated semiconductor wafers with deionized water. The drying process is performed to dry the semiconductor wafers.

Conventionally, as disclosed for example in U.S. Pat. No. 5,829,156, a spin dryer is used to perform the drying process. However, as integrated circuits become more complicated, the use of a spin dryer becomes problematic. This is because the spin dryer employees centrifugal force. Therefore, it is very difficult to completely remove minute water droplets remaining on a wafer, and a wafer may inadvertently become contaminated by eddies generated by the high-rotational forces applied to the wafer.

To overcome these problems, semiconductor substrates have been dried using organic compounds such as isopropyl alcohol. Typically a vapor dryer, a Marangoni dryer, and a spray dryer have been used with the organic compounds. When using the vapor dryer, isopropyl alcohol (IPA) is heated inside a process chamber, and then resulting IPA vapors displace deionized water adhering to a surface of wafers. In a Marangoni dryer, wafers are dried by a Marangoni effect taking advantage of the low surface tension of IPA vapors. In a spray dryer, externally generated IPA vapors are injected in a process chamber, and then the IPA vapors displace deionized water adhering to a wafer surface. Other conventional methods and systems are disclosed in U.S. Pat. No. 5,054,210 and Japanese Laid-Open Publication No. 10-335299.

Most drying systems use organic compounds, e.g., IPA vapors, as a drying source to dry the wafers. However, the conventional systems do not have any means to precisely detect and control the flow of IPA vapors into, and the flow of IPA vapors within a process chamber.

SUMMARY OF THE INVENTION

In one aspect, the present invention provides a drying apparatus capable of preventing poor process conditions by properly providing dry gases in a process chamber.

In another aspect of the present invention, there is provided an apparatus for drying substrates containing a process chamber adapted to dry the substrates using a dry gas, a measuring unit adapted to measure a density of dry gas flowing through a measuring region, and a control unit adapted to control an amount of the dry gas supplied to the process chamber in accordance with the measured density of the dry gas.

In another aspect of the present invention, there is provided an apparatus used to dry substrates, comprising, a process chamber adapted to dry the substrates using a dry gas, a gas supply pipe connected to the process chamber to supply the dry gas, an exhaust pipe connected to the process chamber to exhaust the dry gas, a measuring unit adapted to measure a density of dry gas flowing through a measuring region of the process chamber, and a control unit adapted to control an amount of dry gas supplied to the process chamber in accordance with the measured density of the dry gas.

BRIEF DESCRIPTION OF THE DRAWINGS

The present invention now will be described more fully hereinafter with reference to the accompanying drawings, in which embodiments of the present invention are shown. However, this invention should not be construed as limited to the embodiments set forth herein. Rather, these embodiments are provided as working examples.

DESCRIPTION OF EXEMPLARY EMBODIMENT(S)

The present invention will be described more fully hereinafter with reference to the accompanying drawings in which embodiments of the present invention are shown.

In the present specification, a spray dryer used to dry wafers is disclosed. However, the present invention is applicable to other dryers such as a Marangoni dryer and a vapor dryer. In addition, isopropyl alcohol are vapors disclosed as an exemplary dry gas source. However, other organic compounds may be used as the dry gas source.

Figure 1:
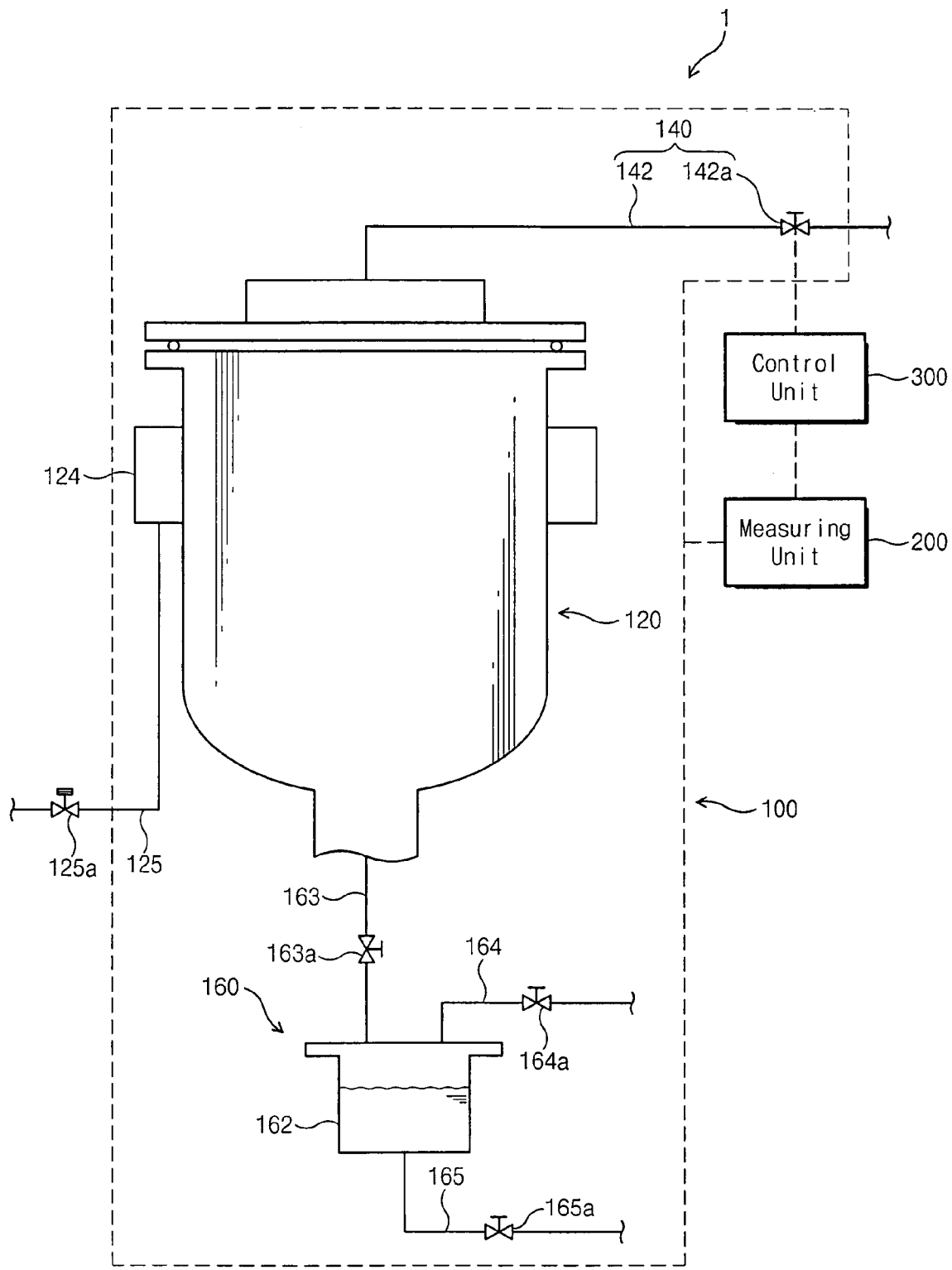
FIG. 1 schematically illustrates a drying apparatus according to an embodiment of the present invention.

With reference to FIG. 1, a drying apparatus 1 includes a substrate treatment unit 100, a measuring unit 200, and a control unit 300. Substrate treatment unit 100 dries wafers using a dry source gas. Substrate treatment unit 100 has a hermetically sealed process chamber 120. Process chamber 120 is connected to a supply gas unit 140 and an exhaust unit 160. Gas supply unit 140 supplies drying gas to chamber 120. Exhaust unit 160 exhausts fluid from chamber 120. Gas supply unit 140 includes a vapor generating unit (not shown) to generate vapors, and a supply pipe 142 connecting process chamber 120 with the vapor generating unit. Supply pipe 142 is preferably connected to a top surface of process chamber 120. A mass flow controller 142a is adapted to control the flow of gases through supply pipe 142. Mass flow controller 142a is also connected to a control unit 300. Control unit 300 controls mass flow controller 142a. Mass flow controller 142a can also be adapted to be manually controlled. Exhaust unit 160 includes a buffer unit 162 to temporarily store exhausted fluid from process chamber 120. An exhaust pipe 163 connects process chamber 120 with buffer unit 162. A fluid exhaust pipe 165 to exhaust the store fluid is connected to a lower portion of buffer unit 162. A gas exhaust pipe 164 to exhaust gas is connected to an upper portion of buffer unit 162. Exhaust valves 163a, 164a, and 165a are adapted to open and close exhaust pipes 163, 164, and 165, respectively.

Figure 2:
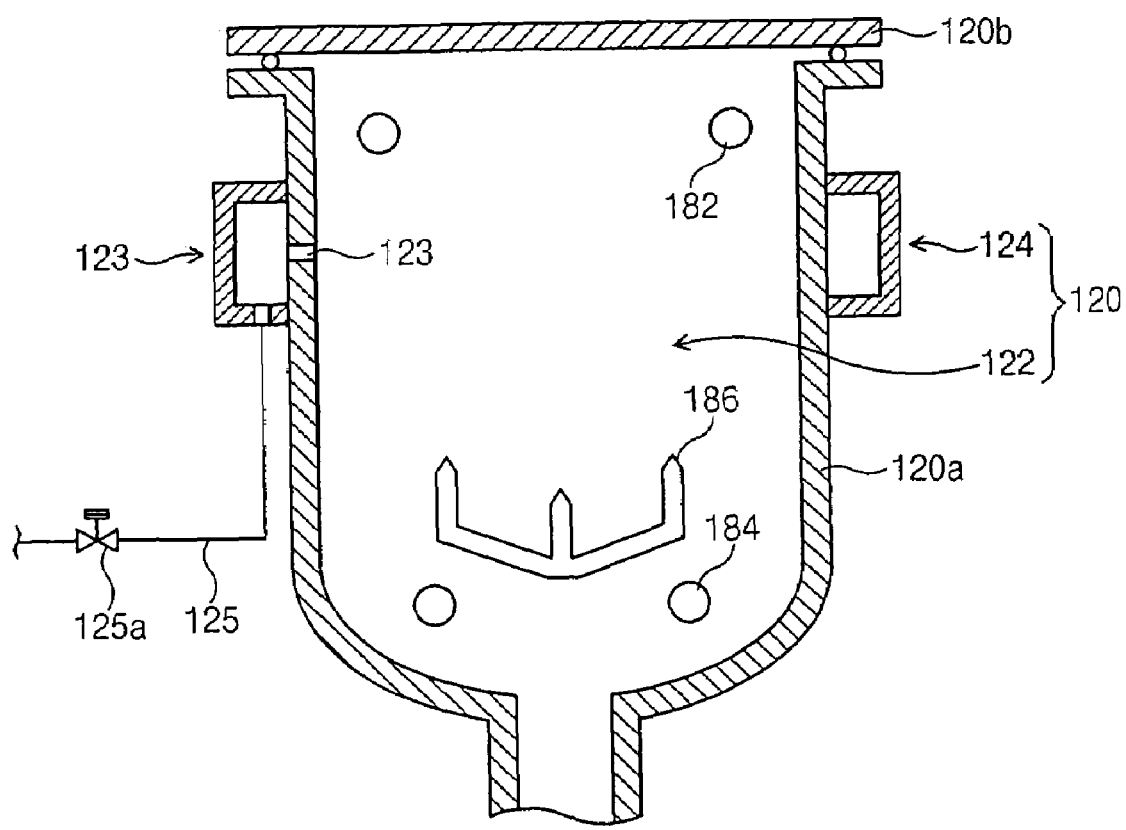
FIG. 2 is a cross-sectional view of a process chamber of FIG. 1.

With reference to FIG. 2, process chamber 120 includes a body 120a and a cap 120b. Body 120a provides a space to house and dry the wafers, and cap 120b is adapted to open and close the upper portion of body 120a. Body 120a has an inner bath area 122 and an outer bath area 124. A supporting plate 186 to support wafers is mounted in inner bath 122, and a cleaning liquid supply nozzle 184 is adapted to supply cleaning liquid to inner bath 122. Cleaning liquid is preferably a chemical solution including fluorine or ammonium used during the liquid chemical processing process, or may be deionized water used in the rinsing process. An outlet 123 is formed on a sidewall of inner bath 122. Deionized wafer flows through outlet 123. Outer bath 124 disposed at an external sidewall of inner bath 122. Deionized water overflowing from inner bath 122 through outlet 123 during the rinsing process is stored in outer bath 124 and then exhausted by a water exhaust pipe 125 connected at a bottom surface of outer bath 124. A valve 125a is adapted to open and close water exhaust pipe 125. A dry gas supply nozzle 182 is adapted to supply dry gas to inner bath 122 is disposed on an upper portion of inner bath 122.

Dry gas source preferably includes an organic compound. In this regards, alcohol vapors may be used as the organic compound. In other words, it is preferable to use isopropyl alcohol (IPA) as the alcohol source. Additionally, ethylglycol, 1-propanol, 2-propanol, tetrahydrofurane, 4-hydroxy-4-methyl-2-pentanol, 1-butanol, 2-butanol, methanol, ethanol, acetone, or dimethylether may be used as the alcohol source. Alcohol vapors are transported to process chamber 120 by carrier gas such as nitrogen gas.

During a drying process, measuring unit 200 measures density of organic compounds (e.g., isopropyl alcohol) in substrate treatment unit 100. Measuring unit 200 is adapted at a predetermined position in substrate treatment unit 100. For example, measuring unit 200 may be adapted on supply pipe 142 or exhaust pipes 163 and 164 to measure the density of IPA flowing through these pipes. Measuring unit 200 may also be adapted to process chamber 120 to measure the density of IPA flowing therein. Hereinafter, a region in which the density of IPA is measured is referred to as "a measuring region".

Figure 3:
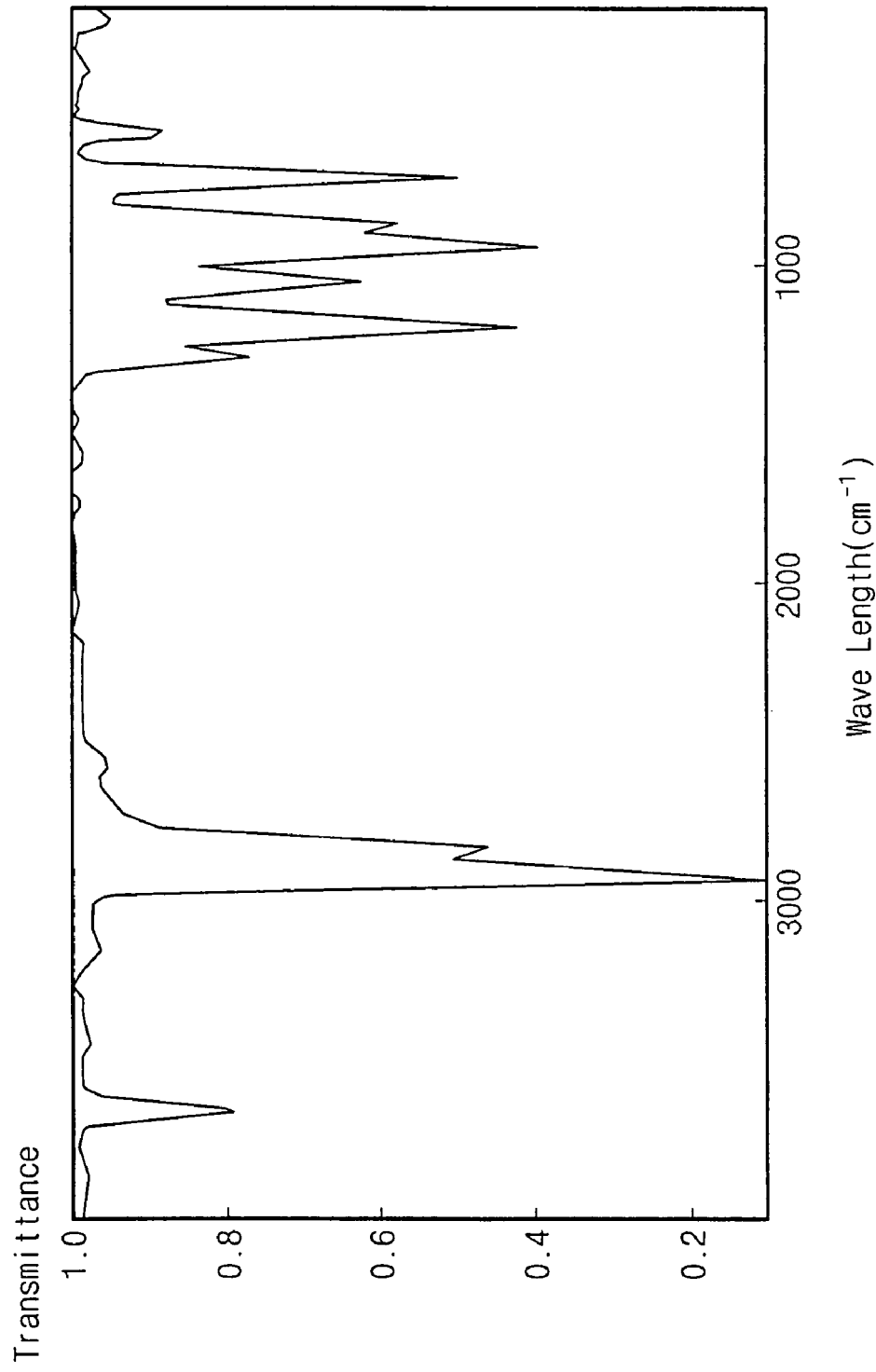
FIGS. 3 to 5 are graphs illustrating the wavelengths at which infrared rays are absorbed by isopropyl alcohol, carbon dioxide, and water.
Figure 4:
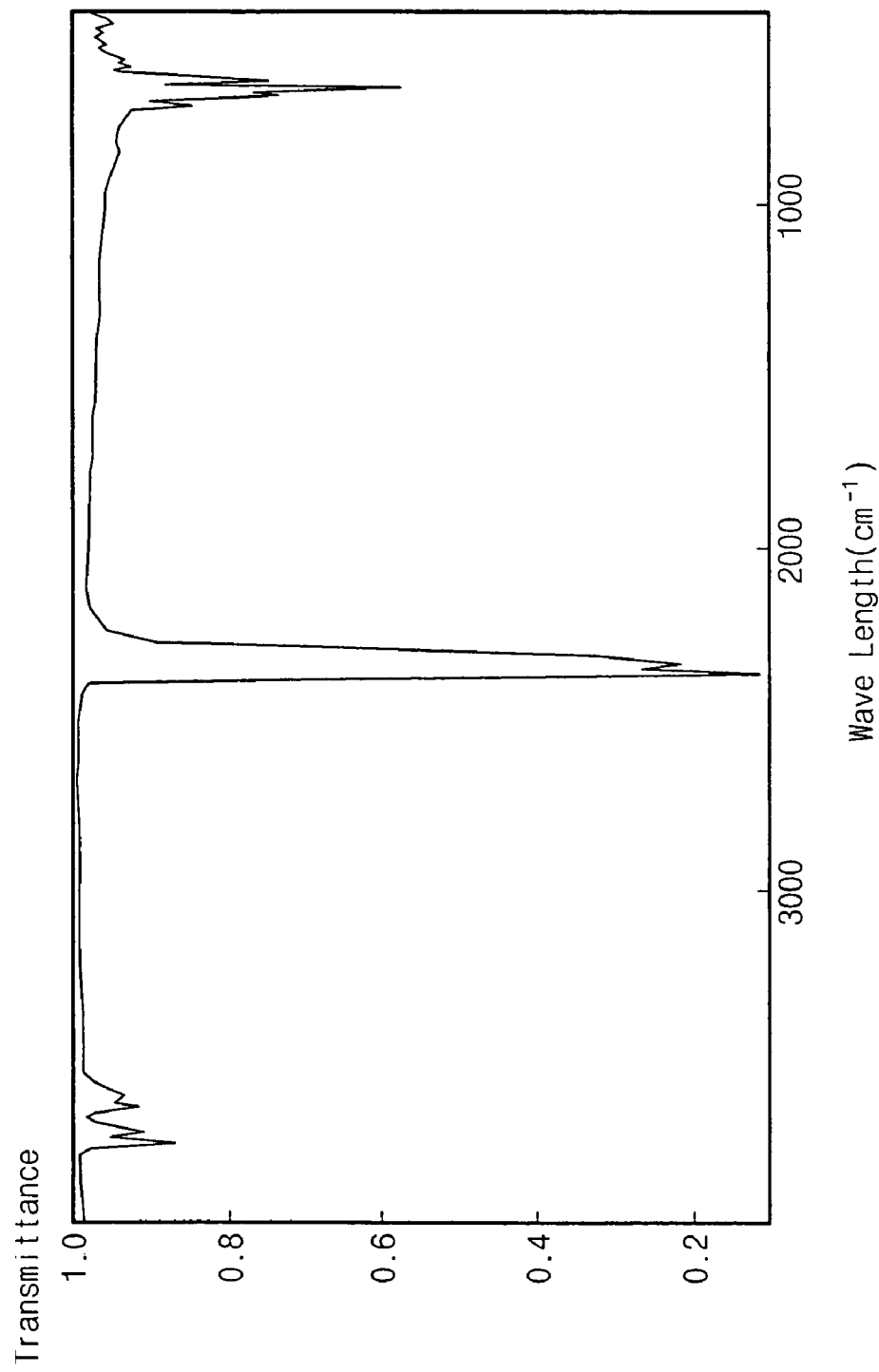
Figure 5:
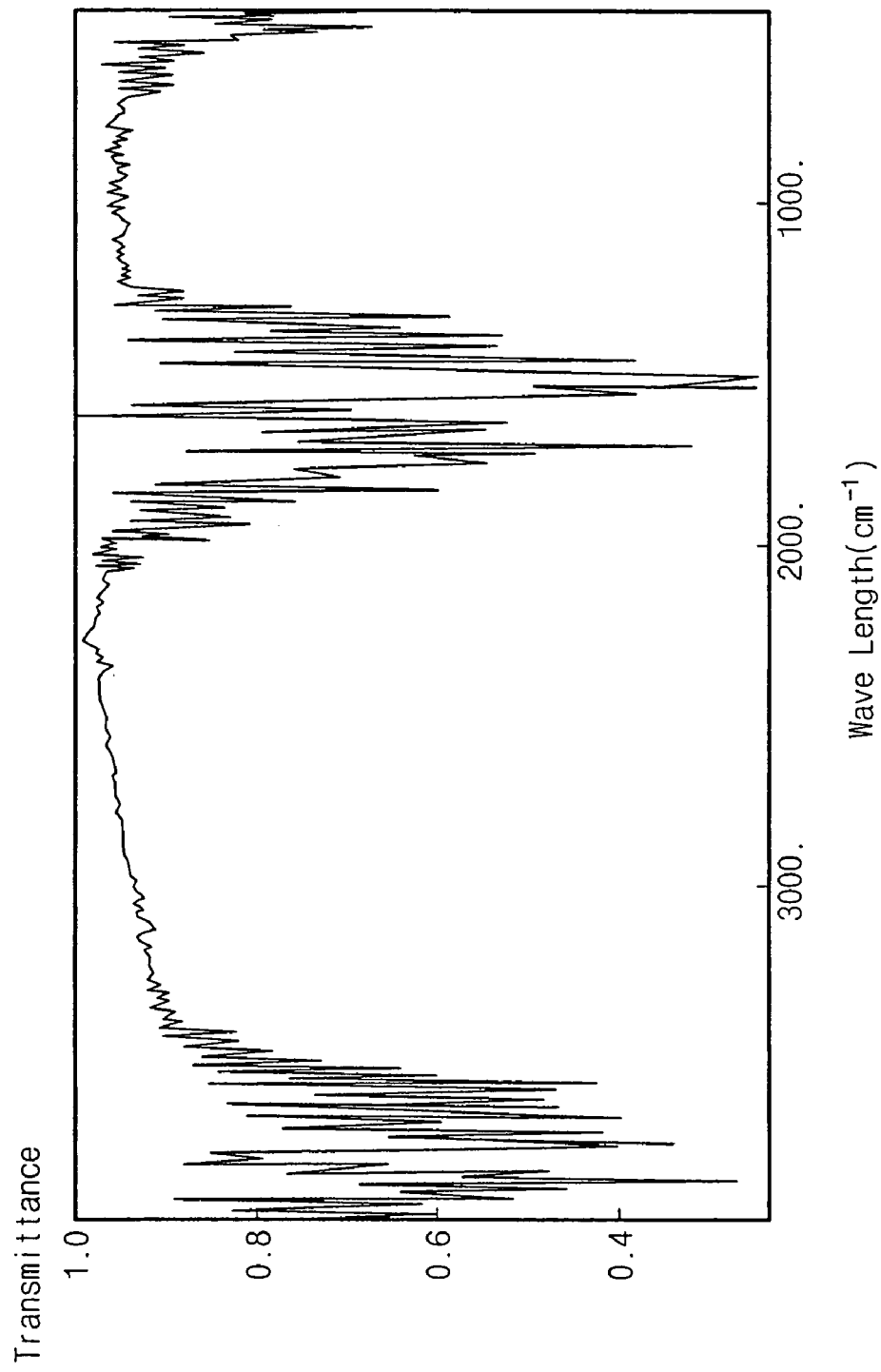

When infrared light is irradiated to the measuring region, infrared light collides with gas molecules flowing within the measuring region and are absorbed in a specific wavelength band. Depending on the type of gas molecules, a wavelength band for the absorbed infrared light is different. FIGS. 3 through 5 are graphs illustrating wavelength band for infrared light absorbed by isopropyl alcohol, carbon dioxide, and water, which respectively flow within the measuring region. As shown in FIG. 3, the wavelength band where infrared light is most absorbed by alcohol is approximately between 2800 $cm^{-1}$ and 3000 $cm^{-1}$. As shown in FIGS. 4 and 5, wavelength band for carbon dioxide and water, respectively, are not between 2800 $cm^{-1}$ and 3000 $cm^{-1}$. Accordingly, when IPA is present in the measuring region the transmittance of infrared light between 2800 $cm^{-1}$ to 3000 $cm^{-1}$ changes. By calculating the change of infrared light transmittance in this wavelength band, it is possible to measure the density of the IPA flowing in the measuring region. Information regarding the density of IPA vapors detected by measuring unit 200 is transferred to control unit 300. Then, control unit 300 compares the measured density of the IPA vapors to a corresponding value for mass flow controller 142a, which in turns controls the flow of IPA vapor to process chamber 120.

Figure 6:
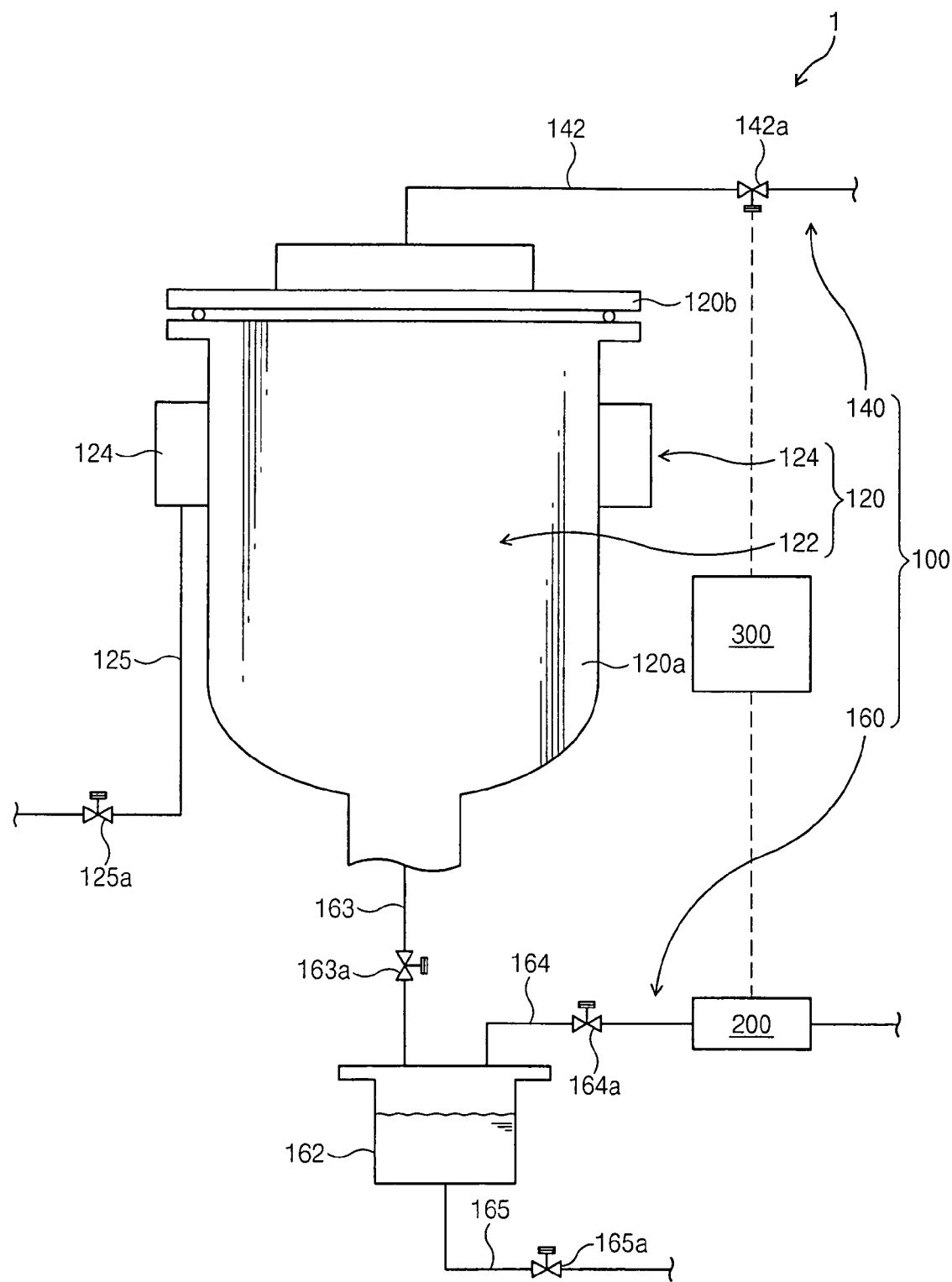
FIG. 6 schematically illustrates another embodiment of the drying apparatus of the present invention.
Figure 7:
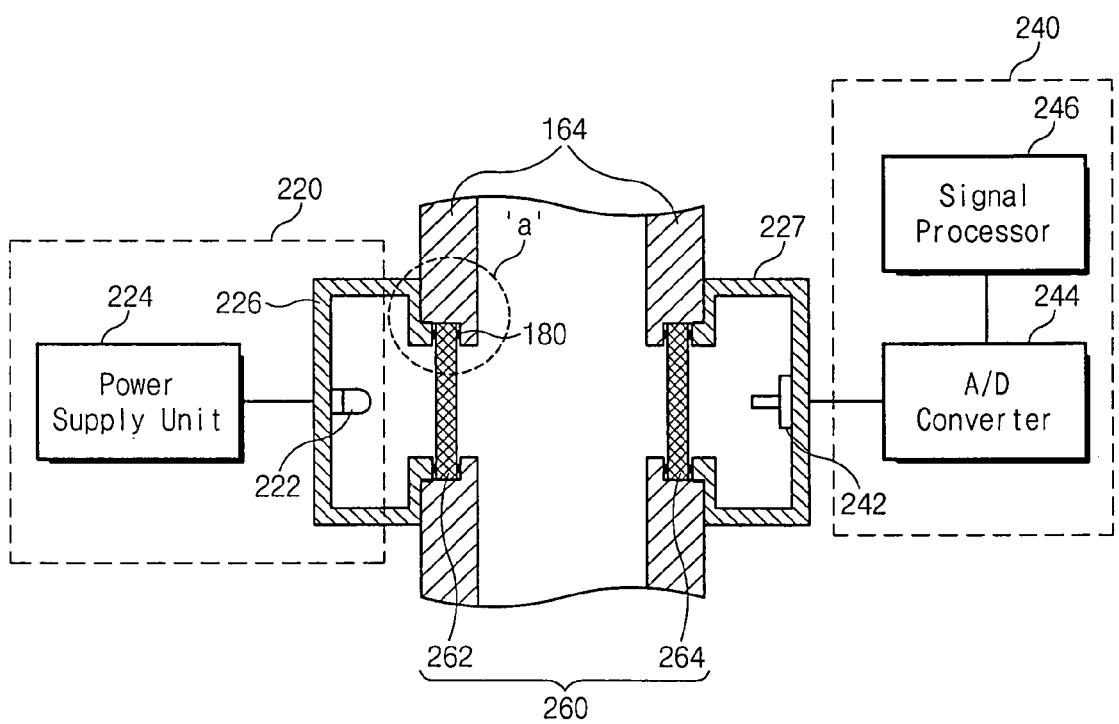
FIG. 7 is a detailed cross-sectional view of the measuring unit of FIG. 6.

FIG. 6 schematically illustrates drying apparatus 1 and measuring unit 200 adapted for connection to gas exhaust pipe 164. FIG. 7 is a detailed cross-sectional view of measuring unit 200 of FIG. 6. With reference to FIGS. 6 and 7, measuring unit 200 includes a luminescence unit 220 disposed on a first frame 226, a detection unit 240, and a window unit 260. Luminescence unit 220 is disposed on one side of window unit 260 and includes a power supply unit 224, and an infrared light source 222 illuminating an infrared light sensor 242. Detection unit 240 is arranged outside of window unit 260. Detection unit 240 includes infrared light sensor 242, an A/D converter 244, and a signal processor 246. Infrared light sensor 242 is disposed opposite of infrared light source 222 and disposed on a second frame 227. A/D converter 244 converts the received light to a digital signal. Signal processor 246 receives the digital signal, measures the intensity of the light, and thereby estimates the density of the gases. In other words, signal processor calculates the digital signal and sends a control signal to control unit 300, wherein based on the control signal, control unit 300 controls mass flow controller 142a to regulate the flow of dry gas into process chamber 120.

Figure 8:
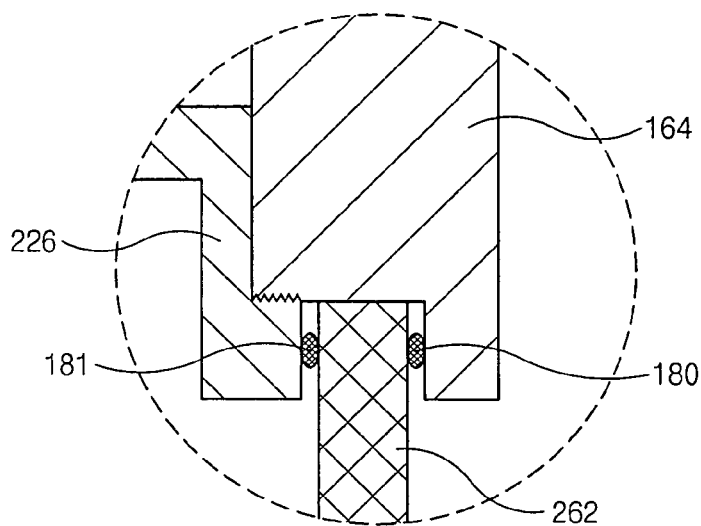
FIG. 8 is a magnified view "a" of FIG. 7.

Window unit 260 is disposed between luminescence unit 220 and detection unit 240. Window unit 260 prevents fluid from the measuring region from flowing into luminescence unit 220 or detection unit 240. Window unit 260 includes a first window 262 and a second window 264. First window 262 is disposed on one side of gas exhaust pipe 164, and second window 264 is disposed on the opposite side of first window 262. Specifically as shown in FIG. 8, there is a first opening in a sidewall of exhaust pipe 164. The first opening is flanged at its inner perimeter. First window 262 is mounted onto the flanged portion. An O-ring 180 is disposed between first window 262 and the flanged portion. On the outer perimeter of the first opening, first frame 226 is adapted to be mounted on first window 262 and gas exhaust pipe 164. Another O-ring 181 is disposed between first frame 226 and first window 262. The portion of first frame 226, i.e., end portion, mounted onto the first opening and gas exhaust pipe 164 is preferably stepped. It is understood that the configuration of the opposite first window 262 is similar. In other words, there is a second opening opposite the first opening. The second opening is flanged at its inner perimeter. Second window 264 is mounted onto the flanged portion. An O-ring 180 is disposed between second window 264 and the flanged portion. On the outer perimeter of the second opening, second frame 227 is adapted to be mounted on second window 264 and exhaust pipe 164. Another O-ring 181 is disposed between second frame 227 and second window 264. The portion of second frame 227, i.e., end portion, mounted onto the second opening and exhaust pipe 164 is preferably stepped.

First and second windows 262 and 264 allow the transmission of infrared light. First and second windows 262 and 264 are formed of a material having a strong resistance to corrosion.

Figure 9:
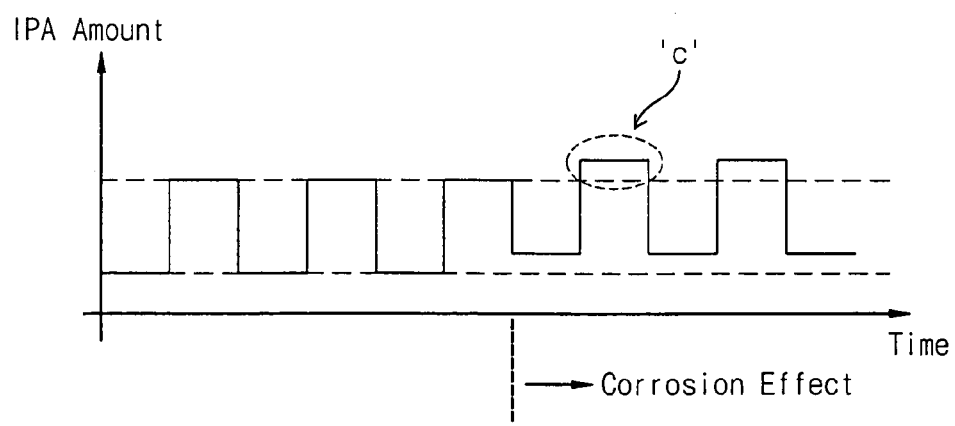
FIG. 9 is a graph illustrating a problem that may arise if a first or a second window is eroded.

FIG. 9 is a graph illustrating a problem that may arise if first and second windows 262 and 264 wear out due to corrosion. During a chemical process and rinsing process, IPA vapors are not required for these processes. However, during a drying process, IPA vapors are continuously provided in a steady amount. If first and second windows 262 and 264 are etched or worn by acid or base, measuring unit 200 may detect an erroneous volume of IPA vapors due to variations in the thickness of first and second windows 262 and 264.

Figure 10:
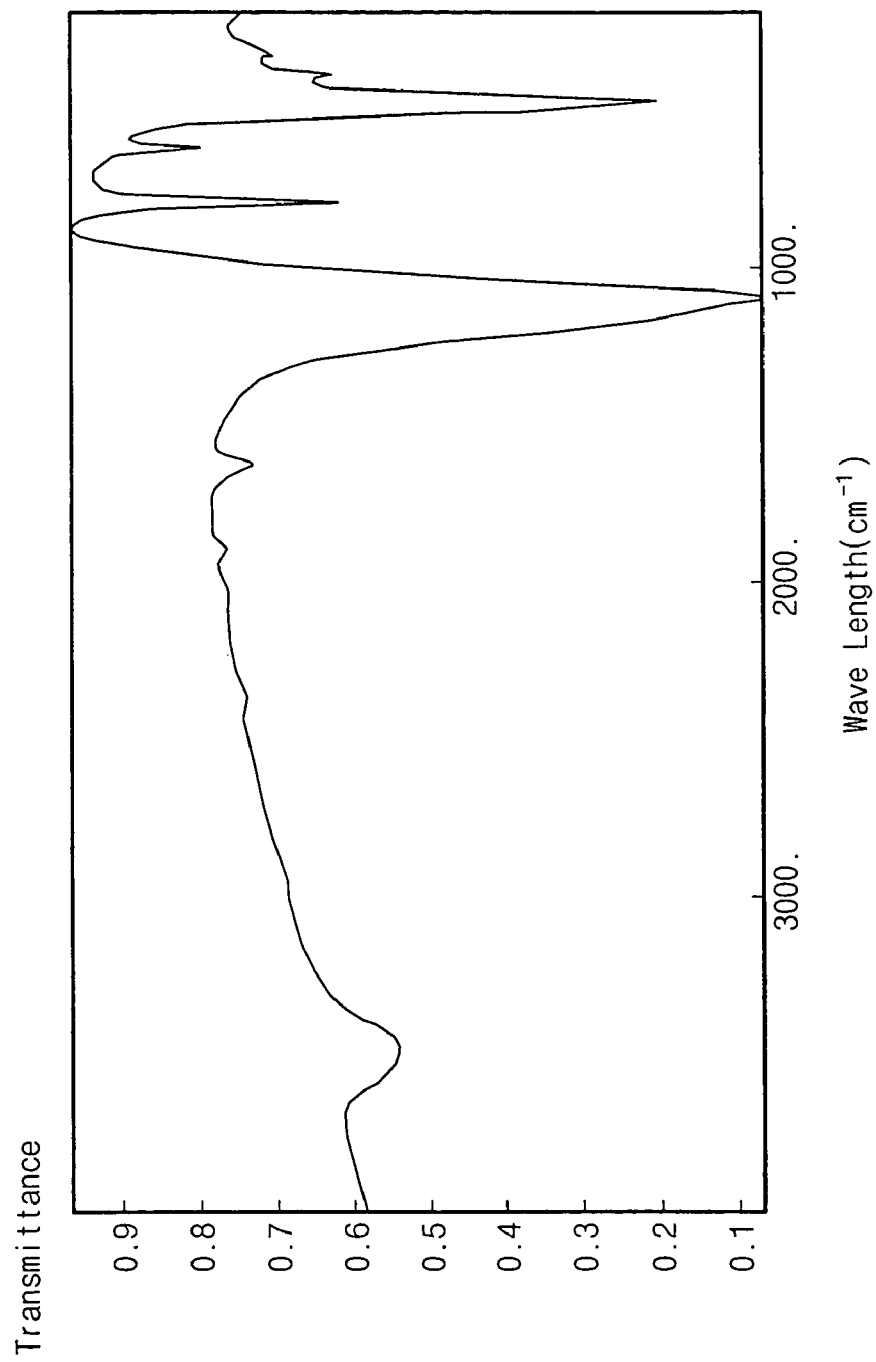
FIG. 10 is a graph showing wavenumber in which light is absorbed by a silica-based material.

Therefore, in the present embodiment, first and second windows 262 and 264 are formed of a silica-based material such as glass or quartz. The silica-based material has a high resistance to corrosion by organic materials such as alcohol. As illustrated in FIG. 10, the silica-based material transmits infrared light well in a wavelength band of 2800 $cm^{-1}$ to 3000 $cm^{-1}$.

Figure 11A:
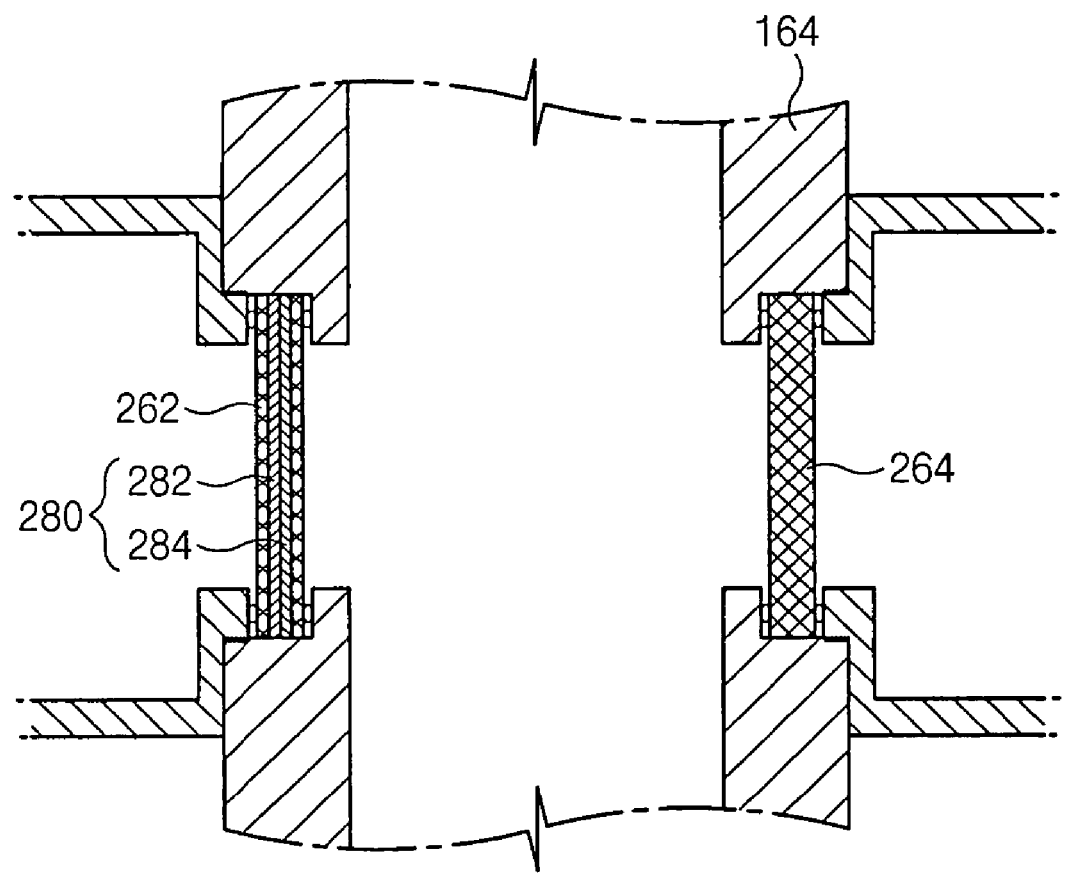
FIGS. 11A, 11B, and 11C illustrate various installation positions of a low pass filter and a high pass filter.
Figure 11B:
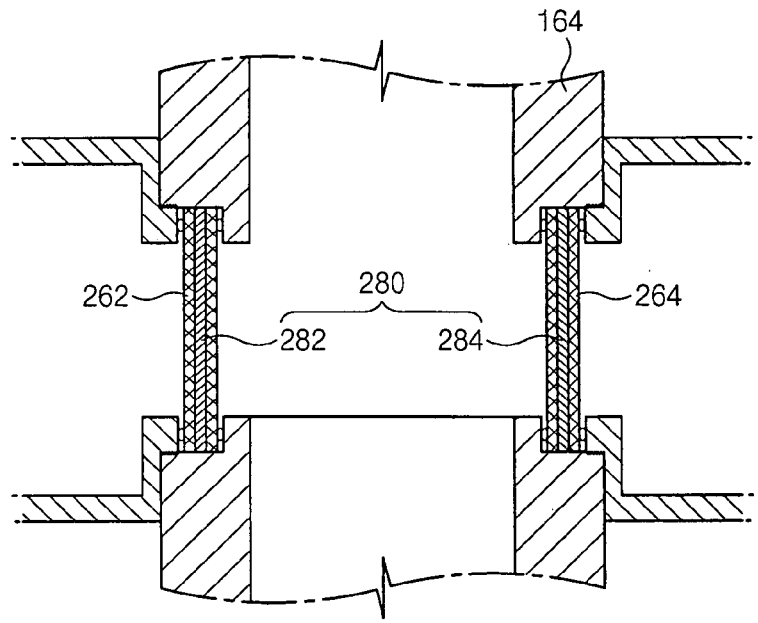

As shown in FIG. 11A, measuring unit 200 may further include a filter unit 280, which only transmits light in a wavelength band corresponding to the detected infrared light sensor 242. Filter unit 280 is arranged on first window 262. Filter unit 280 includes a low pass filter 282 and a high pass filter 284. High and low pass filters 284 and 282 are preferably formed of a material such as carbonate or sulfate. Preferably, high and low pass filters 282 and 284 are arranged so that they are not in direct contact with fluids flowing through the measuring region. High and low pass filters 282 and 284 are inserted in first window 262 or second window 264. As shown in FIG. 11B, only low pass filter 282 is inserted in first window 262, and only high pass filter 284 is inserted in second window 264. As shown FIG. 11C, high and low pass filters 282 and 284 are arranged between first window 262 and infrared-ray luminous source, or between second window 264 and infrared light sensor 242 (not shown).

Figure 12:
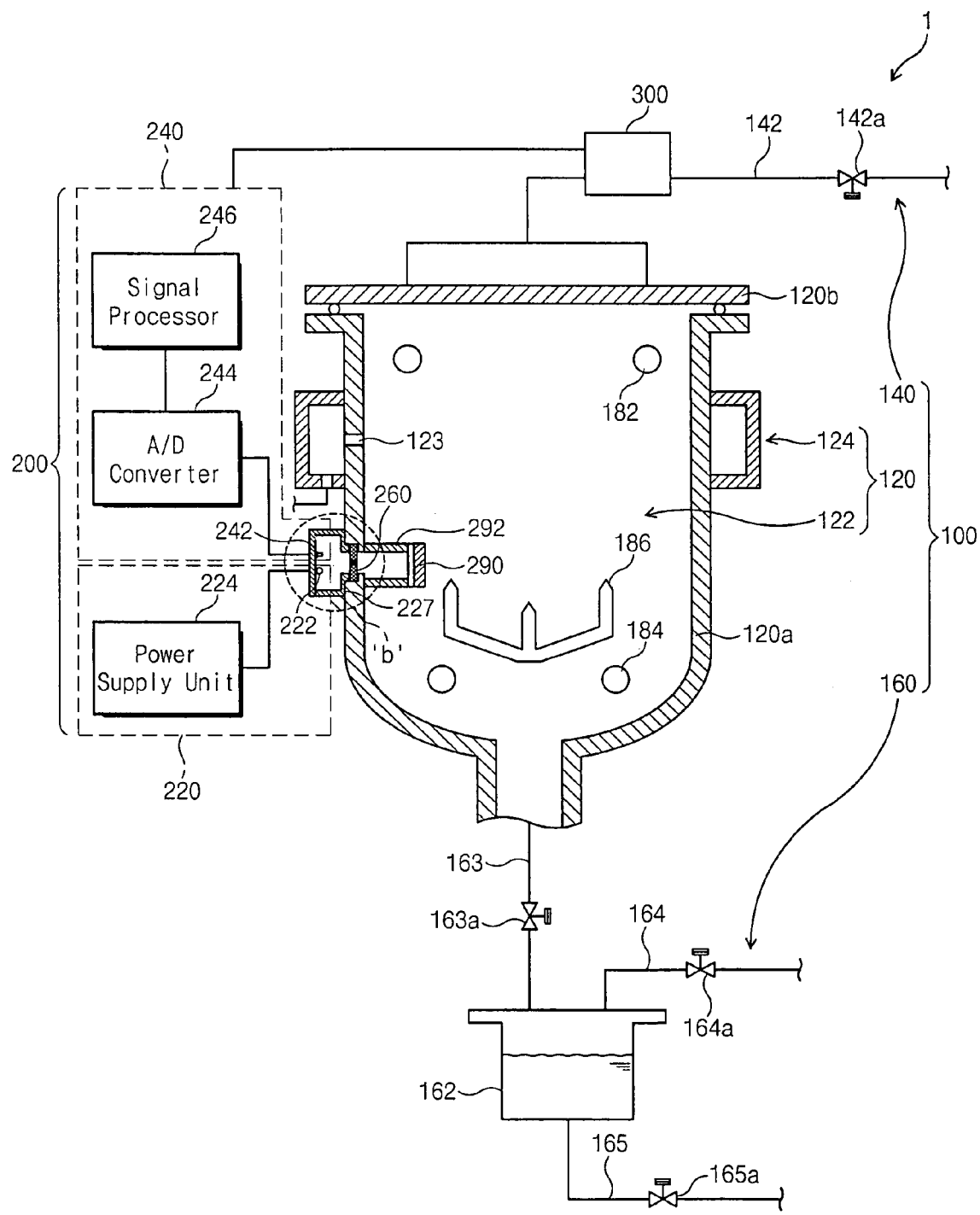
FIG. 12 schematically illustrates yet another embodiment of the drying apparatus of the present invention.
Figure 13:
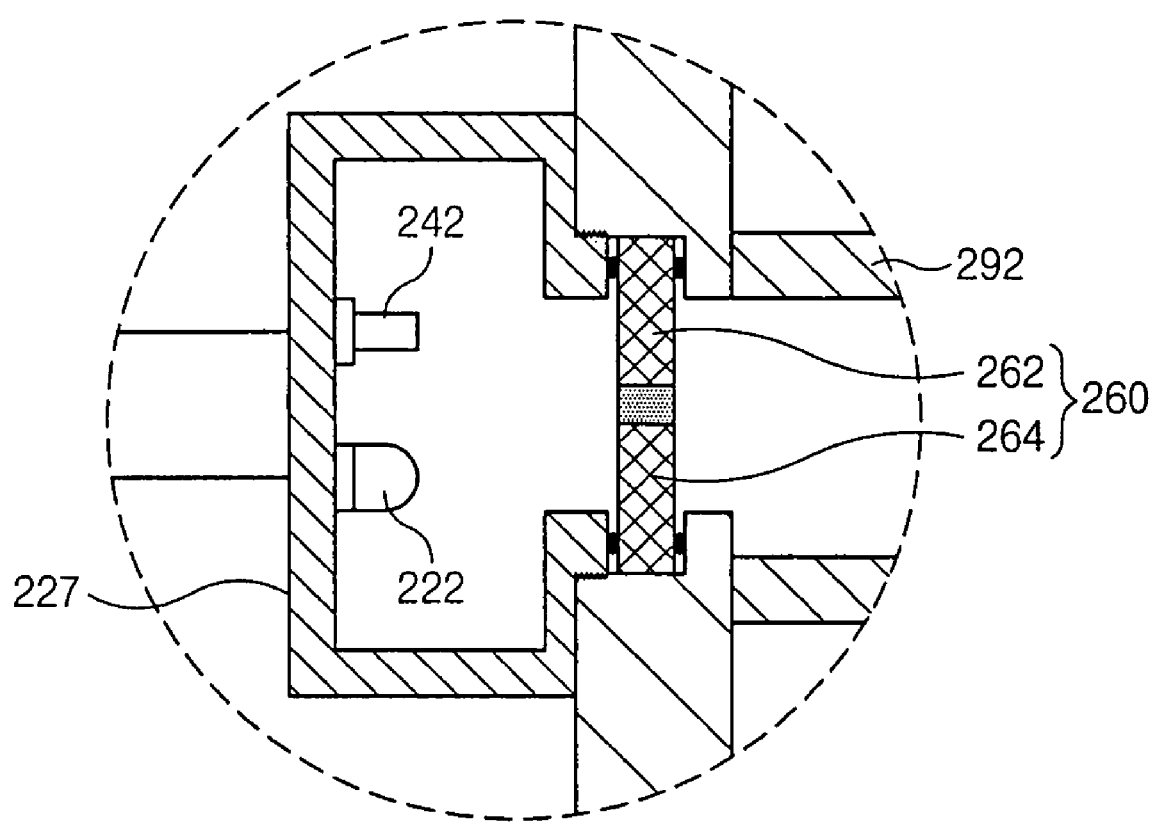
FIG. 13 is a magnified view of element "b" of FIG. 12.

FIG. 12 schematically illustrates measuring unit 200 disposed in another area of the dry apparatus 1, i.e., another embodiment of the present invention. In FIG. 12, measuring unit 200 is mounted on process chamber 120. With reference to FIGS. 12 and 13, measuring unit 200 includes a frame 227, a luminescence unit 222, a detection unit 240, a window unit 260 as well as an anti-reflecting plate 290. Frame 227 is mounted on an external sidewall of process chamber 120. First and second windows 262 and 264 are inserted on a sidewall of process chamber 120. In frame 227, an infrared light source 222 and an infrared light sensor 242 are arranged horizontally or vertically. First and second windows 262 and 264 and anti-reflecting plate 290 may be tilted at an angle in order for irradiated light from infrared light source 222 to hit anti-reflecting plate 290 and then reach infrared light sensor 242. Infrared-ray luminous source 222 is connected to a power supply 224. Infrared light sensor 242 is connected to an A/D converter 244 and a signal processor 246.

Anti-reflecting plate 290 in process chamber 120 is arranged to be a certain distance away from first and second windows 262 and 264. Anti-reflecting plate 290 is fixed with the inner sidewall of process chamber 120 by a plurality of supporting plates 290. A predetermined distance and space are formed between anti-reflecting plate 290 and external sidewalls of process chamber 120.

Measuring unit 200 measures density of IPA vapors inside process chamber 120. First and second windows 262 and 264 are formed of a silica-based material such as glass or quartz.

Figure 11C:
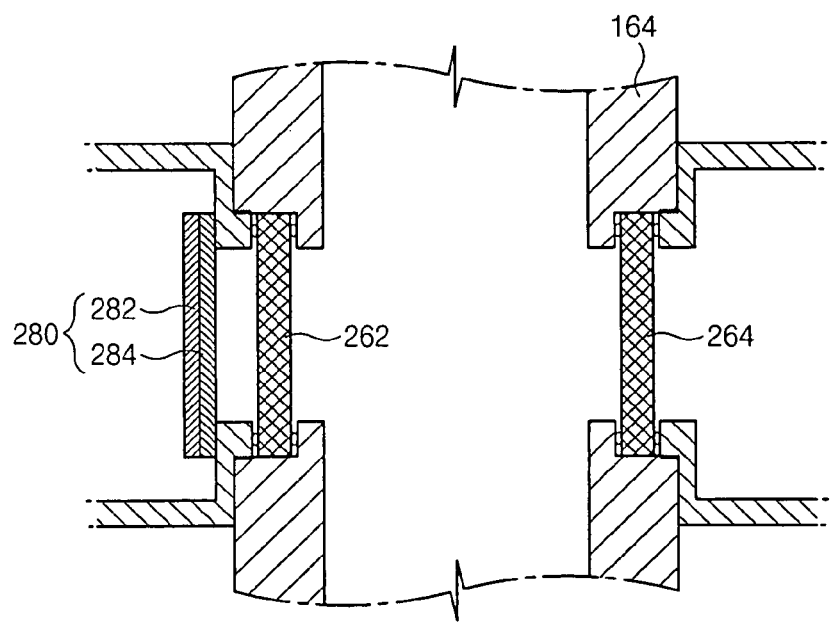

Although not shown, a filter including a low pass filter and a high pass filter may be adapted to this embodiment similarly as shown in FIGS. 11A–C.

In the present embodiment, measuring unit 200 is mounted on the sidewall of process chamber 120. However, measuring unit 200 may be mounted on a cap 120b of process chamber 120.

As shown in FIG. 12, when measuring unit 200 is mounted on the sidewall of process chamber 120, it is possible to precisely measure the density of IPA vapors in process chamber 120. As shown in FIG. 7, when measuring unit 200 is mounted on exhaust pipes 142, 163, and 164, the density of IPA vapors is not as precisely measured as compared with direct measurement of IPA vapors of FIG. 12. However, the difference between both measurements is negligible. If measuring unit 200 is mounted on process chamber 120 there is a possibility that atmosphere current flow may be hindered by anti-reflecting plate 290 or supporting plate 186 in process chamber 120. However, if measuring unit 200 is mounted on pipes 142, 163, and 164, there is no problem with the atmosphere current flow in process chamber 120 in performing the drying process.

Now, a process for performing a drying process using an apparatus of FIG. 6 or FIG. 12 will be described. Wafers are loaded on a supporting plate 186 in an inner bath 122 of a process chamber 120. Chemicals and deionized wafer are sequentially supplied from a cleaning liquid supply nozzle 184 or an outlet 123 to inner bath 122 to perform a chemical processing process and a rinsing process, respectively. Then, IPA vapors are supplied in inner bath 122 by a supply pipe 142 to dry the wafers. The wafers are dried by Marangoni effect or displacing deionized water adhering to a surface of wafers with IPA vapors. The density of IPA vapors is measured by a measuring unit 200 disposed on a pipe 142 or one of the exhaust pipes 163 and 164, or process chamber 120. Measuring unit 200 transfers measured result to a control unit 300. Control unit 300 controls a mass fluid controller 142, which in turns controls the flow of IPA vapors supplied to process chamber 120.

Infrared light is irradiated from an infrared light source 222 arranged in a measuring region. An infrared light sensor 242 receives light passing through the measuring region. The received light is converted to a digital signal or an analog signal by an A/D converter 244. A signal processor 246 uses variation in the strength of the detected light to calculate the density of IPA vapors in measuring unit 200.

The drying apparatus of the present invention has the capacity to measure in real-time the density of isopropyl alcohol supplied to dry wafers. The drying apparatus also has the capacity to control the flow of isopropyl alcohol during the drying process. As a result, it is possible to more effectively perform the drying process.

What is claimed is:

1. An apparatus for drying substrates, comprising:
   a process chamber adapted to dry the substrates using a dry gas;
   a gas supply pipe adapted to supply the dry gas to the process chamber;
   a mass flow controller connected the gas supply pipe to control the supply of the dry gas;
   a buffer unit;
   a first exhaust pipe connecting the process chamber and the buffer unit;
   a second exhaust pipe connected to the buffer unit to exhaust the dry gas;
   valves disposed in-line with the first and second exhaust pipes;

a measuring unit mounted to the second exhaust pipe and adapted to measure a density of dry gas flowing through a measuring region within the second exhaust pipe; and a control unit operatively connected to the measuring unit and to the mass flow controller and adapted to command the mass flow controller to control an amount of the dry gas supplied to the process chamber in accordance with the measured density of the dry gas.

2. The apparatus of claim 1, wherein the measuring unit comprises:

a luminescence unit comprising an infrared light source, wherein the infrared light source illuminates the measuring region with infrared light; and a detection unit comprising an infrared light sensor to detect infrared light from the infrared light source, an Analog/Digital converter to convert the detected infrared light to a digital signal, and a signal processor to calculate a control signal in relation to the digital signal.

3. The apparatus of claim 2, wherein the measuring unit further comprises a window unit comprising a first window and a second window disposed opposite each other on the second exhaust pipe, wherein the first and second windows are formed of a silicia-based material;

a first frame connected to the first window and fixing the infrared light source; and a second frame connected to the second window and fixing the infrared light sensor.

4. The apparatus of claim 3, wherein the first and second windows are formed of glass or quartz.

5. The apparatus of claim 3, wherein the window unit further comprises a filtering unit having a low pass filter and a high pass filter.

6. An apparatus used to dry substrates, comprising:

a process chamber adapted to dry the substrates using a dry gas;

a gas supply pipe connected to the process chamber to supply the dry gas;

an exhaust pipe connected to the process chamber to exhaust the dry gas;

a measuring unit adapted to measure a density of dry gas flowing through a measuring region of the process chamber, wherein the measuring unit comprises a frame disposed outside of and mounted to the process chamber, an infrared light source and an infrared sensor supported by and disposed side-by-side within the frame, first and second windows disposed side-by-side within a wall of the process chamber and optically aligned with the infrared light source and the infrared sensor, respectively, an anti-reflecting plate disposed within the process chamber and oriented to direct infrared light transmitted through the first window into the process chamber back through the second window, whereby the infrared light will be detected by the infrared sensor; and a control unit operatively connected to the measuring unit and adapted to control an amount of dry gas supplied to the process chamber in accordance with the measured density of the dry gas.

7. The apparatus of claim 6, wherein the measuring unit further comprises:

an Analog/Digital converter to convert the infrared light detected by the infrared sensor to a corresponding digital signal, and a signal processor to calculate a control signal in relation to the digital signal.

8. The apparatus of claim 6, further comprising a mass flow controller connected to the gas supply pipe, wherein the control unit is operatively connected to the mass flow controller to command the mass flow controller to control supply the dry gas to the process chamber in accordance with the control signal.

9. The apparatus of claim 8, wherein the first and second windows are formed of a silicia-based material.

10. The apparatus of claim 9, wherein the first and second windows are formed of glass or quartz.

11. The apparatus of claim 9, wherein the measuring unit further comprises a low pass filter and a high pass filter.

12. The apparatus of claim 11, wherein the low pass and the high pass filters are disposed on the first window, or one of the low pass and the high pass filters is disposed on the first window and the other filter is disposed on the second window.

13. An apparatus for drying substrates, comprising:

a source of isopropyl alcohol;

a process chamber connected to the source of isopropyl alcohol and adapted to dry the substrates using isopropyl alcohol vapor derived from said source;

a pipe extending from the process chamber; and a measuring unit adapted to measure the density of isopropyl alcohol vapor flowing through a measuring region of the pipe, the measuring unit comprising first and second windows each of a silica-based material and which are disposed across the measuring region from each other within a wall of the pipe, an infrared light source disposed outside the first window and positioned to illuminate the measuring region with infrared light through the first window, an infrared light sensor disposed outside the second window and positioned to detect infrared light propagating through the second window from measuring region, an Analog/Digital converter to convert the detected infrared light to a digital signal, and a signal processor to calculate a control signal in relation to the digital signal.

14. The apparatus of claim 13, wherein the measuring unit further comprises a first frame supporting the infrared light source and mounted to the first window outside the pipe, and a second frame supporting the infrared light sensor and mounted to the second window outside the pipe.

15. The apparatus of claim 13, wherein the pipe is a gas supply pipe that connects the source of isopropyl alcohol to the process chamber.

16. The apparatus of claim 13, wherein the pipe is an exhaust pipe through which gas flows from the process chamber.

17. The apparatus of claim 13, wherein the silica-based material is a material selected from the group consisting of glass and quartz.

18. The apparatus of claim 13, further comprising a control unit operatively connected to the measuring unit and adapted to control an amount of isopropyl alcohol vapor, supplied to the process chamber, in accordance with the measured density of the isopropyl alcohol vapor.

* * * * *